United States Patent [19]

Schweingruber et al.

[11] 4,402,135

[45] Sep. 6, 1983

[54] METHOD OF FORMING A CIRCUIT BOARD

[75] Inventors: Otto Schweingruber, Glashütten; Werner Häfner, Buchen-Hainstadt, both of Fed. Rep. of Germany

[73] Assignee: Braun Aktiengesellschaft, Kronberg, Fed. Rep. of Germany

[21] Appl. No.: 250,830

[22] Filed: Apr. 3, 1981

[30] Foreign Application Priority Data

Apr. 11, 1980 [DE] Fed. Rep. of Germany ....... 3014041

[51] Int. Cl.³ .............................................. H05K 3/30
[52] U.S. Cl. .................................. 29/832; 174/68.5; 264/104; 361/401; 29/848; 29/829
[58] Field of Search ............... 29/832, 848, 846, 829; 427/96; 174/68.5; 264/104, 105, 255, 259, 272.17; 361/397, 401

[56] References Cited

U.S. PATENT DOCUMENTS

| 3,339,008 | 8/1967 | MacArthur et al. | 174/68.5 |
| 4,034,467 | 7/1977 | Sapunarow et al. | 29/848 |
| 4,157,407 | 6/1979 | Peiffer | 29/848 X |

FOREIGN PATENT DOCUMENTS

| 1098560 | 2/1961 | Fed. Rep. of Germany . | |
| 1440866 | 5/1970 | Fed. Rep. of Germany . | |
| 1915756 | 10/1970 | Fed. Rep. of Germany . | |
| 2007818 | 9/1972 | Fed. Rep. of Germany . | |
| 2336917 | 3/1974 | Fed. Rep. of Germany . | |
| 2854385 | 6/1980 | Fed. Rep. of Germany . | |
| 53-863 | 1/1978 | Japan | 29/832 |
| 53-47801 | 1/1978 | Japan | 427/96 |
| 53-47806 | 6/1978 | Japan | 427/96 |
| 53-100468 | 9/1978 | Japan | 29/846 |
| 54-122866 | 9/1979 | Japan | 29/846 |
| 1248601 | 10/1971 | United Kingdom . | |
| 1427579 | 3/1976 | United Kingdom | 29/846 |

OTHER PUBLICATIONS

IBM Tech. Discl. Bull., vol. 2, No. 1, Jun. 1959, p. 9.

Primary Examiner—Francis S. Husar
Assistant Examiner—Carl J. Arbes
Attorney, Agent, or Firm—Raymond J. De Vellis

[57] ABSTRACT

A circuit board is fabricated by injection molding a support of an insulating material. The support is provided with channels in the pattern of conductive paths. The channels are filled by injection with electrically conductive plastic, and electrically conductive metal is precipitated galvanoplastically on the plastic.

2 Claims, 6 Drawing Figures

METHOD OF FORMING A CIRCUIT BOARD

BACKGROUND OF THE INVENTION

This invention relates to a process for forming a circuit board. More particularly, this invention relates to a method for applying electrically conducting paths to a support of an insulating material.

The support can be designed as a flat plate or as a body with planes at different heights or with planes at an angle to one another. Supports with conductive paths for electrical current are primarily used in electrical and electronic miniature devices.

From the German Utility Model No. 1 966 250, an electronic circuit board arrangement is known in which metal layers are applied as current paths on a support consisting of an insulating material. The support is a three-dimensional body consisting of a well known plastic, such as of ABS polymers. In particular an ABS graft polymerizate is disclosed onto which the current paths are applied electrolytically.

A method of forming conductive paths is known from the following article: Rempel, reprint "New Observations on the Chemogalvanic Metallization of Form Bodies of ABS Polymerizates" from "Fachberichte für Oberflächentechnik" (Technical Reports on Surface Technology) 1970. This method involved the following steps: attacking the butadiene component by etching, especially with chromic sulfuric acid; coating it with lacquer in the desired pattern; precipitating a very thick metal layer autocatalytically; and then applying thereon electrolytically the metal layer which forms the current path.

The method in Rempel is associated with a number of difficulties and creates environmental hazards because of the use of chromic sulfuric acid in etching. Further, in production, it was generally not possible to produce three-dimensional boards with conductive paths for electrical current, in a reproducible manner and in large quantities.

The present invention has the aim of making available a process for applying electrically conductive paths on a support consisting of insulating material, which makes possible the application of conductive paths according to the particular pattern desired, in a reproducible and economic fashion, and the production of such boards in large numbers.

SUMMARY OF THE INVENTION

The invention achieves its aim by a process for applying electrically conductive paths on a support consisting of an insulating material. It is characterized as follows: The support is fabricated by injection molding and is provided with channels in the pattern of the conductive paths. These channels are filled by injection with an electrically conductive plastic. Subsequently, an electrically conductive metal is precipitated galvanoplastically on the electrically conductive metal, in a manner that is in itself well known.

In a preferred embodiment, the channels are filled with electrically conductive plastic in such a manner that grooves are formed between the sides of the electrically conductive plastic filler and the support.

Briefly stated, it is an object of this invention to provide a method of forming a circuit board which includes a support consisting of an insulating material and having conductive paths for electrical current in a desired design which can be manufactured in a reproducible fashion, economically, and in large numbers.

BRIEF DESCRIPTION OF THE DRAWINGS

The invention may be better understood by reference to the following detailed description when taken in conjunction with the accompanying drawing, in which.

DESCRIPTION OF THE PREFERRED EMBODIMENT

The support is made of an insulating material such as an electrically nonconductive plastic that can be formed by injection molding. An electrically conductive plastic which can be formed by injection is suitable for the practice of this invention.

The processes of injection molding and of injection are performed with machines and tools that are in themselves well known, and operate in a well known manner. The galvanoplastic precipitation of the electrically conductive metal is also performed in well known manner.

In a preferred embodiment, the channels serve as guides for the form for injecting the electrically conductive plastic. The walls of the form prevent the channels from being completely filled up, and, as a result, the support which consists of an insulating material is separated from the electrically conductive plastic by grooves at the side walls of the latter. During the galvanoplastic precipitation of the electrically conductive metal, the metal is precipitated into these grooves. This results in a better anchoring of the metal precipitate.

An advantage of the method according to this invention is that electrical components can also be affixed before the electrically conductive metal is galvanoplastically precipitated. As a result of this precipitation process, the components can be solidly connected in such a fashion that soldering is obviated.

Another advantage of the method according to this invention is that conductive paths for electrical current can also be applied to interior parts of hollow bodies, e.g. housings.

Figure 1:
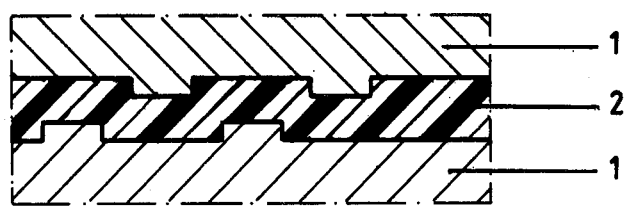
FIG. 1 is a cross-sectional view of a first mold member with insulating material, in accordance with this invention.
Figure 2:
FIG. 2 is a cross-sectional view of the insulating material of FIG. 1, removed from the mold member, in accordance with this invention.

Referring now to FIG. 1 of the drawing, a mold member 1 includes a cavity into which an insulating material is injected to form an insulating support member 2 having channels in the desired pattern of one or more electrically conductive paths. FIG. 2 illustrates the formed insulating support member 2 after removal from the mold 1.

Figure 3:
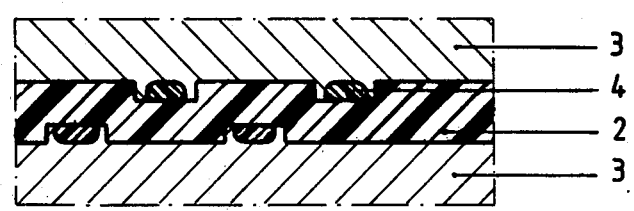
FIG. 3 is a cross-sectional view of a second mold member including the insulating material of FIG. 2 and an electrically conductive plastic, in accordance with this invention.
Figure 4:
FIG. 4 is a cross-sectional view of the insulating material and electrically conductive plastic of FIG. 3, removed from the second mold member, in accordance with this invention.

In FIG. 3, a second mold member 3 is illustrated which receives the formed support member 2. Second mold member 3 is formed with wall portions which extend into the channels of the support member 2 to prevent the channels from being completely filled up, when an electrically conductive plastic 4 is injected into the mold member 3, thereby separating the insulating support member 2 from the electrically conductive plastic 4 by grooves. The grooves 5, formed at the side walls of the electrically conductive plastic 4, after the support member 2 is removed from the second mold member 3, is best seen in FIG. 4.

Figure 5:
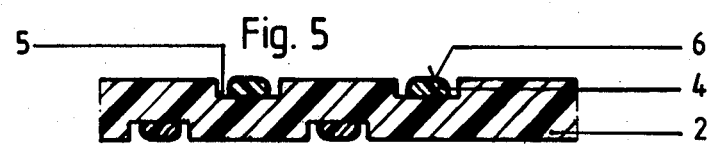
FIG. 5 is a cross-sectional view of the insulating material and electrically conductive plastic of FIG. 4, after precipitating an electrically conductive metal galvanoplastically on the electrically conductive plastic, in accordance with this invention.

In FIG. 5, the support member 2 with its formed electrically conductive plastic 4 formed in the channels of the support member 2 has an electrically conductive metal 6 galvanoplastically precipitated on the electrically conductive plastic 4 and in the grooves 5 of the support member 2.

Figure 6:
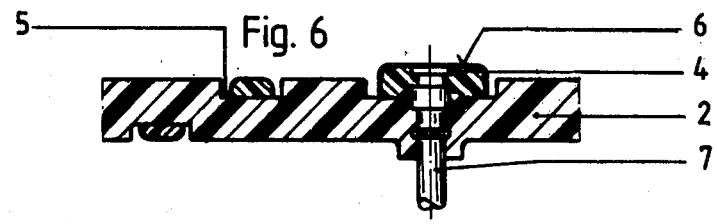
FIG. 6 is a cross-sectional view of a second embodiment of a formal printed circuit board, including a pin, in accordance with this invention.

FIG. 6 illustrates a second embodiment of this invention in which an electrical component or pin 7 is affixed to the electrically conductive plastic 4 before the step of galvanoplastically precipitating the electrically conductive metal 6 on the electrically conductive plastic 4.

While an embodiment and application of this invention has been described, it will be apparent to those skilled in the art that many more modifications are possible without departing from the inventive concepts herein described. The invention, therefore, is not to be restricted except as necessary by the prior art and by the spirit of the appended claims.

What is claimed as new and desired to be secured by Letters Patent of the United States is:

1. A method of forming a circuit board comprising the steps of:

fabricating by injection molding a support of an insulating material having channels in the pattern of one or more electrically conductive paths;

injecting an electrically conductive plastic in the channels of the support through a form means having wall portions which cooperate with the channels, the wall portions of the form preventing the channels from being completely filled and thereby forming spaces between the sides of the electrically conductive plastic and the sides of the channels when the form means is removed; and precipitating an electrically conductive metal galvanoplastically on the electrically conductive plastic and in the formed spaces.

2. The method as in claim 1 further including the step of affixing pins to the electrically conductive plastic before the step of precipating.

* * * * *